United States Patent
Saito et al.

(10) Patent No.: US 10,163,231 B2
(45) Date of Patent: Dec. 25, 2018

(54) MAGNETIC RESONANCE IMAGING APPARATUS AND IMAGE PROCESSING APPARATUS

(71) Applicant: Toshiba Medical Systems Corporation, Otawara-shi (JP)

(72) Inventors: Kanako Saito, Kawasaki (JP); Hidenori Takeshima, Ebina (JP)

(73) Assignee: Toshiba Medical Systems Corporation, Otawara-shi (JP)

( * ) Notice: Subject to any disclaimer, the term of this patent is extended or adjusted under 35 U.S.C. 154(b) by 282 days.

(21) Appl. No.: 15/248,414

(22) Filed: Aug. 26, 2016

(65) Prior Publication Data

US 2017/0069115 A1 Mar. 9, 2017

(30) Foreign Application Priority Data

Sep. 3, 2015 (JP) .................................. 2015-174122

(51) Int. Cl.
*G06T 11/00* (2006.01)
*G01R 33/48* (2006.01)
(Continued)

(52) U.S. Cl.
CPC ........ *G06T 11/005* (2013.01); *G01R 33/4818* (2013.01); *G01R 33/565* (2013.01); *G06K 9/6215* (2013.01); *G06T 11/006* (2013.01); *G01R 33/482* (2013.01); *G01R 33/5611* (2013.01); *G06T 2200/12* (2013.01)

(58) Field of Classification Search
CPC . G06T 11/005; G06T 11/006; G06T 2200/12; G01R 33/4818; G01R 33/482; G01R 33/5611; G01R 33/565; G06K 9/6215
See application file for complete search history.

(56) References Cited

U.S. PATENT DOCUMENTS 6,630,828 B1 * 10/2003 Mistretta ............ G01R 33/4824
324/300
7,764,810 B2 * 7/2010 Rahmes .............. G06K 9/00026
382/100
(Continued)

FOREIGN PATENT DOCUMENTS

JP 10-234707 9/1998

OTHER PUBLICATIONS

Jeffrey Tsao, et al. "k-t BLAST and k-t SENSE: Dynamic MRI With High Frame Rate Exploiting Spatiotemporal Correlations", Magnetic Resonance in Medicine 50:1031-1042, 2003, 12 pages.

*Primary Examiner* — Shefali D Goradia
(74) *Attorney, Agent, or Firm* — Oblon, McClelland, Maier & Neustadt, L.L.P.

(57) ABSTRACT

A magnetic resonance (MR) imaging apparatus of embodiments includes processing circuitry. The processing circuitry generates a third k-space data group including a first k-space data group and a second k-space data group, by adding the second k-space data group that is arranged in a second range adjacent to a first range, to the first k-space data group that is arranged in the first range and that is undersampled along at least one of the axes in k-space as well as in any axis that is different from the axes in the k-space. The processing circuitry generates an MR image group by performing a reconstruction process on the third k-space data group.

12 Claims, 11 Drawing Sheets

(51) Int. Cl.
    *G06K 9/62*     (2006.01)
    *G01R 33/565*     (2006.01)
    *G01R 33/561*     (2006.01)

(56) References Cited

U.S. PATENT DOCUMENTS

| | | | |
|---|---|---|---|
| 8,116,541 B2* | 2/2012 | Brau | G01R 33/3415 |
| | | | 382/128 |
| 9,239,367 B2* | 1/2016 | Holmes | G01R 33/4824 |
| 9,858,689 B1* | 1/2018 | Mailhe | A61B 5/00 |
| 2006/0273792 A1* | 12/2006 | Kholmovski | G01R 33/5611 |
| | | | 324/309 |

* cited by examiner

US 10,163,231 B2

MAGNETIC RESONANCE IMAGING APPARATUS AND IMAGE PROCESSING APPARATUS

CROSS-REFERENCE TO RELATED APPLICATIONS

This application is based upon and claims the benefit of priority from Japanese Patent Application No. 2015-174122, filed on Sep. 3, 2015; the entire contents of which are incorporated herein by reference.

FIELD

Embodiments described herein relate generally to a magnetic resonance imaging apparatus and an image processing apparatus.

BACKGROUND

Magnetic resonance imaging (MRI) apparatuses transform information about the inside of subjects into images using a nuclear magnetic resonance phenomenon. An example of such MRI apparatuses acquires data called k-space data by sampling nuclear resonance signals from specific atomic nuclei (e.g., atomic nuclei of hydrogen atoms) in a subject and applies Fourier transform to the k-space data so as to produce magnetic resonance (MR) images.

DETAILED DESCRIPTION

A magnetic resonance imaging apparatus of embodiments includes processing circuitry. The processing circuitry generates a third k-space data group including a first k-space data group and a second k-space data group. The third k-space data group is obtained by adding the second k-space data group that is arranged in a second range adjacent to a first range, to the first k-space data group that is arranged in the first range. The first k-space data group is undersampled along at least one of the axes in k-space as well as in any axis that is different from the axes in the k-space. The processing circuitry generates an MR image group by performing a reconstruction process on the third k-space data group.

The following describes a magnetic resonance imaging apparatus and an image processing apparatus according to embodiments in detail.

First Embodiment

Figure 1:
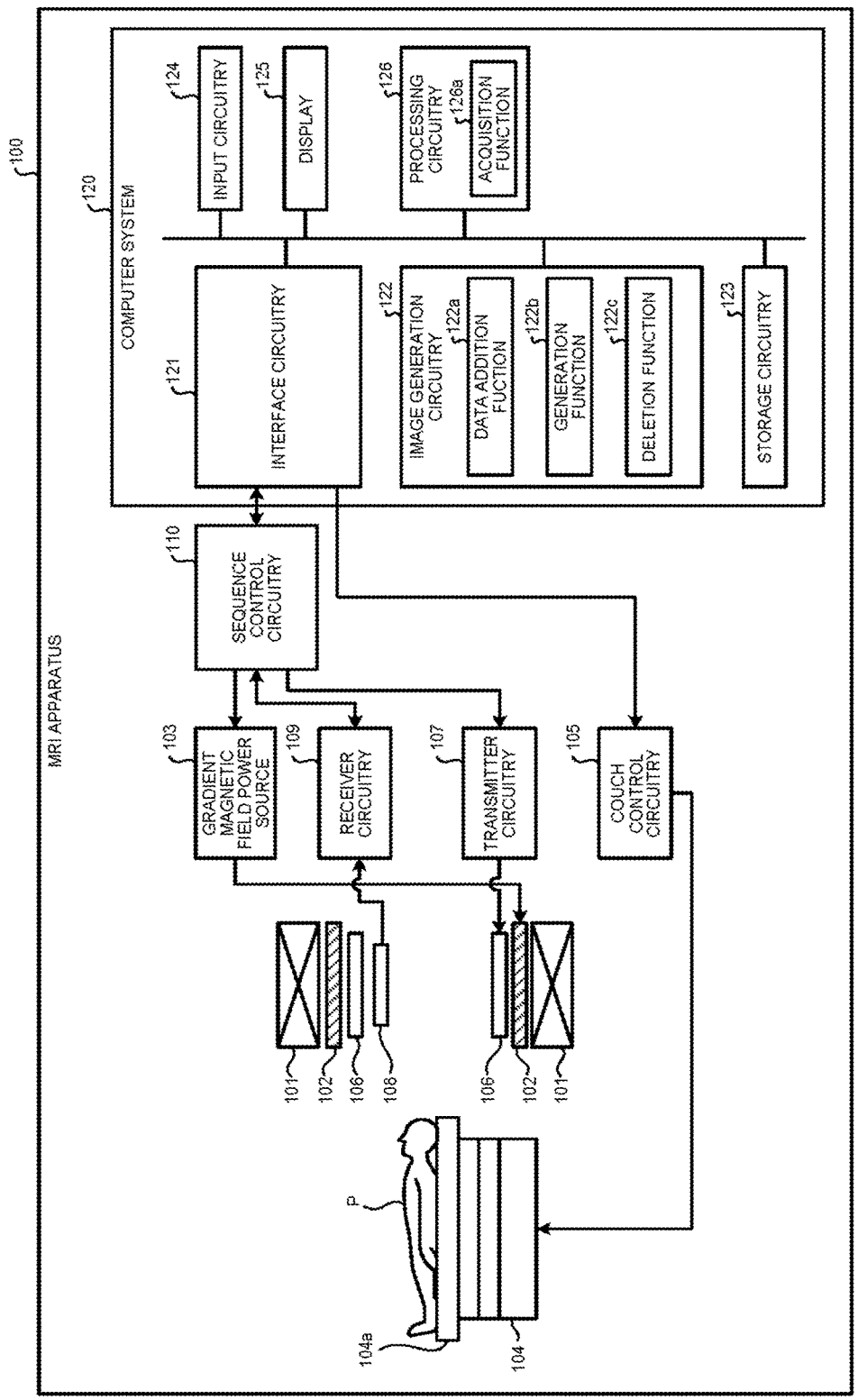
FIG. 1 is a functional block diagram illustrating a magnetic resonance imaging (MRI) apparatus according to a first embodiment.

FIG. 1 is a functional block diagram illustrating an MRI apparatus 100 according to a first embodiment. As illustrated in FIG. 1, the MRI apparatus 100 includes a static magnetic field magnet 101, a gradient coil 102, a gradient magnetic field power source 103, a couch 104, couch control circuitry 105, a transmitter coil 106, transmitter circuitry 107, a receiver coil array 108, receiver circuitry 109, sequence control circuitry 110, and a computer system 120. The MRI apparatus 100 does not include a subject P (such as a human body).

The static magnetic field magnet 101 is a hollow magnet having a cylindrical shape (including those the cross-section of which perpendicular to the cylinder axis is an oval shape), and generates a uniform static magnetic field in the inside space thereof. Examples of the static magnetic field magnet 101 include a permanent magnet and a superconductive magnet.

The gradient coil 102 is a hollow coil having a cylindrical shape (including those the cross-section of which perpendicular to the cylinder axis is an oval shape), and disposed inside the static magnetic field magnet 101. The gradient coil 102 is formed of a combination of three coils that correspond to respective axes of K, Y, and Z that are orthogonal to each other. The three coils are individually supplied with an electric current from the gradient magnetic field power source 103, and each generates a gradient magnetic field having a magnetic field strength that varies along the respective axes of K, Y, and Z. In this example, the gradient magnetic fields on the respective axis of X, Y, and Z generated by the gradient coil 102 correspond to a slice-selecting gradient magnetic field Gs, a phase-encoding gradient magnetic field Ge, and a read-out gradient magnetic field Gr, respectively, for example. The slice-selecting gradient magnetic field Gs is used to determine a given image capturing cross-section. The phase-encoding gradient magnetic field Ge is used to alter the phase of an MR signal depending on a spatial location. The read-out gradient magnetic field Gr is used to alter the frequency of the MR signal depending on the spatial location.

The gradient magnetic field power source 103 supplies an electric current to the gradient coil 102. The gradient magnetic field power source 103 individually supplies an electric current to the three coils that form the gradient coil 102, respectively, for example.

The couch 104 includes a couchtop 104a on which a subject P is placed, and inserts the couchtop 104a in a state where the subject P is placed thereon into a hollow (imaging port) of the gradient coil 102, under the control of the couch control circuitry 105. Generally, the couch 104 is installed such that the longitudinal direction thereof is parallel with the central axis of the static magnetic field magnet 101.

The couch control circuitry 105 drives the couch 104 to move the couchtop 104a in the longitudinal direction and the vertical direction, under the control of the computer system 120.

The transmitter coil 106 is disposed inside the gradient coil 102, and supplied with radio frequency (RF) pulses from the transmitter circuitry 107 to generate a high-frequency magnetic field.

The transmitter circuitry 107 supplies the transmitter coil 106 with RF pulses corresponding to a Larmor frequency that is determined based on the type of target atom nuclei and a magnetic field strength.

The receiver coil array 108 is disposed inside the gradient coil 102, and receives a magnetic resonance signal (hereinafter, referred to as an MR signal) generated from the subject P by influence of the high-frequency magnetic field. When the receiver coil array 108 receives an MR signal, the receiver coil array 108 outputs the received MR signal to the receiver circuitry 109. In the first embodiment, the receiver coil array 108 is a coil array having one or more, typically a plurality of, receiver coils.

The receiver circuitry 109 generates MR data based on the MR signal that is output from the receiver coil array 108. For example, the receiver circuitry 109 generates MR data by converting the MR signal that is output from the receiver coil array 108 into digital data. The receiver circuitry 109 also transmits the generated MR data to the sequence control circuitry 110.

The receiver circuitry 109 may be provided on the gantry device that includes the static magnetic field magnet 101 and the gradient coil 102. In the first embodiment, the MR signals output from the respective coil elements (respective receiver coils) included in the receiver coil array 108 are appropriately divided or combined, and then output to the receiver circuitry 109 in a unit called channel, for example. The MR data is, thus, handled channel by channel in subsequent stages from the receiver circuitry 109 onwards. The total number of coil elements and the total number of channels may be equal to each other. The total number of channels may be smaller than the total number of coil elements, or conversely, the total number of channels may be larger than the total number of coil elements. In the following description, when it is denoted that certain processing is performed "for each channel", the processing may be performed for each coil element or for each channel that is formed by dividing or combining coil elements. The timing at which the coil elements are divided or combined is not limited to the timing described above. The MR signals or the MR data may be divided or combined in a unit of channel until a reconstruction process, which will be described later, is performed.

The sequence control circuitry 110 drives the gradient magnetic field power source 103, the transmitter circuitry 107, and the receiver circuitry 109 based on sequence information transmitted from the computer system 120, thereby imaging the subject P. For example, the sequence control circuitry 110 is implemented using a processor. The sequence information is information that defines a process for executing imaging. The sequence information defines the intensity of the power source to be supplied from the gradient magnetic field power source 103 to the gradient coil 102, timing at which the power source is supplied, the intensity of RF pulses to be transmitted from the transmitter circuitry 107 to the transmitter coil 106, timing at which the RF pulses are applied, and timing at which the receiver circuitry 109 detects an MR signal, for example.

When the sequence control circuitry 110 receives MR data from the receiver circuitry 109 as a result of driving the gradient magnetic field power source 103, the transmitter circuitry 107, and the receiver circuitry 109 to image the subject P, the sequence control circuitry 110 forwards the received MR data the computer system 120.

The computer system 120 controls the whole of the MRI apparatus 100, performs data acquisition, image generation, and others. The computer system 120 includes interface circuitry 121, image generation circuitry 122, storage circuitry 123, input circuitry 124, a display 125, and processing circuitry 126.

The interface circuitry 121 sends the sequence information to the sequence control circuitry 110, and receives the MR data from the sequence control circuitry 110. Upon receiving the MR data, the interface circuitry 121 stores the received MR data in the storage circuitry 123. The processing circuitry 126 places the MR data stored in the storage circuitry 123 in k-space. As a result, the storage circuitry 123 stores therein k-space data of a plurality of channels.

The processing circuitry 126 controls the whole of the MRI apparatus 100. Specifically, the processing circuitry 126 controls imaging by generating sequence information on the basis of imaging conditions input by the operator through the input circuitry 124, and transmits the generated sequence information to the sequence control circuitry 110. The processing circuitry 126 controls the generation of the MR image performed based on the MR data sent from the sequence control circuitry 110 as a result of imaging, and controls the display performed by the display 125. The processing circuitry 126 is implemented using a processor. The processing circuitry 126 has an acquisition function 126a.

The acquisition function 126a controls imaging by generating sequence information on the basis of imaging conditions input by the operator through the input circuitry 124, and sending the generated sequence information to the sequence control circuitry 110. The acquisition function 126a acquires time-series k-space data of the channels, while shifting the sampling positions in the spatial direction. The time-series k-space data is a plurality of pieces of k-space data. The acquisition function 126a then stores the acquired time-series k-space data in the storage circuitry 123.

For example, the acquisition function 126a, which is a structural component of the processing circuitry 126, is stored in the storage circuitry 123 as a computer-executable program. The processing circuitry 126 implements the acquisition function 126a, by reading out the computer program corresponding to the acquisition function 126a from the storage circuitry 123, and executing the computer program being read out. In other words, the processing circuitry 126 that has read out the computer program corresponding to the acquisition function 126a includes the acquisition function 126a in the processing circuitry 126 illustrated in FIG. 1.

The acquisition function 126a is an example of an acquisition circuitry.

The image generation circuitry 122 generates an MR image using the time-series k-space data acquired by the acquisition function 126a and stored in the storage circuitry 123. The image generation circuitry 122 is implemented using a processor. The image generation circuitry 122 includes a data addition function 122a, a generation function 122b, and a deletion function 122c.

The data addition function 122a generates a plurality of pieces of additional k-space data from the k-space data acquired by the acquisition function 126a and stored in the storage circuitry 123. The data addition function 122a then adds the generated additional k-space data to the k-space data acquired by the acquisition function 126a.

The generation function 122b applies inverse Fourier transform to the time-series k-space data of the respective channels to which the additional k-space data is added by the data addition function 122a in the temporal/spatial direction, so as to obtain transformed temporal/spatial data of the respective channels. The generation function 122b then obtains unfolded data by performing unfolding, using the transformed temporal/spatial data of the respective channels and sensitivity distribution information of the respective channels. The generation function 122b applies Fourier transform to the unfolded data in the temporal axis direction.

The deletion function 122c deletes the unfolded data relevant to the time corresponding to the additional k-space data added by the data addition function 122a.

The MR image obtained by the image generation circuitry 122 is displayed on the display 125 or sent to the storage circuitry 123 to be stored therein, as necessary. The image generation circuitry 122 is implemented using a processor.

In this example, the processing functions of the data addition function 122a, the generation function 122b, and the deletion function 122c, which are structural components of the image generation circuitry 122, are stored in the storage circuitry 123 in the form of computer-executable programs, for example. The image generation circuitry 122 implements the function corresponding to each of the computer programs, by reading out each computer program from the storage circuitry 123, and executing the computer program being read out. In other words, the image generation circuitry 122 that has read out the computer programs includes the functions in the image generation circuitry 122 illustrated in FIG. 1. In FIG. 1, the processing functions of the data addition function 122a, the generation function 122b, and the function 122c are executed in the single image generation circuitry 122. However, it is not limited thereto, and a plurality of separate processors may be combined to configure the processing circuitry 126, and the processing function is implemented when each of the processors executes each computer program.

The data addition function 122a is an example of a data addition unit. The generation function 122b is an example of a generation unit. The deletion function 122c is an example of a deletion unit.

The storage circuitry 123 stores therein the MR data received by the interface circuitry 121, the time-series data (k-t space data) disposed in the k-space by the acquisition function 126a, the image data of the MR image generated by the generation function 122b, and others. The storage circuitry 123 also stores therein various computer programs. For example, the storage circuitry 123 is implemented using a semiconductor memory device such as a random access memory (RAM) and a flash memory, a hard disk, an optical disk, and others.

The input circuitry 124 receives various instructions and information inputs from an operator such as a doctor or a medical radiographer. For example, the input circuitry 124 is implemented using a trackball, a switch button, a mouse, a keyboard, and others. The input circuitry 124 is connected to the processing circuitry 126, and transforms the input operations received from the operator to electric signals, and outputs the electric signals to the processing circuitry 126.

The display 125 displays various graphical user interfaces (GUIs), the MR image generated by the generation function 122b, and others, under the control of the processing circuitry 126.

For example, the term "processor" used in the description above means a circuit such as a central processing unit (CPU) and a graphics processing unit (GPU), or an application specific integrated circuit (ASIC) and a programmable logic device (such as a simple programmable logic device (SPLD), a complex programmable logic device (CPLD), and a field programmable gate array (FPGA)). Instead of storing the computer programs in the storage circuitry 123, the computer programs may be installed directly in the processor circuitry. In this case, the processor implements the function by reading out the computer program installed in the circuitry and executing the computer program.

In the MRI apparatus, the nuclear resonance signals (MR signals) are sampled as first-dimensional data. The MRI apparatus acquires data necessary to generate two-dimensional or three-dimensional MR images by repeating first-dimensional sampling in a k-space. When the k-space data is sampled with the same resolution (full sampling) as the MR image to be output, the MR image can be generated by applying Fourier transform to the acquired k-space data.

It is known that the MRI apparatuses take time to perform the sampling. If it takes time to perform the sampling in taking time-series data using the MRI apparatus, an imaging speed is reduced. As a result, imaging cannot follow the movement of the subject. Various techniques to achieve high speed imaging have been researched and developed. One of such techniques is called parallel imaging (PI). In the parallel imaging, a plurality of pieces of the k-space data is acquired using a sampling pattern (undersampling) whose number of samples is smaller than that of full sampling and using a plurality of coils. When Fourier transform is applied to the pieces of the k-space data after the undersampling without any change, aliasing occurs. In the parallel imaging, the MR image having no aliasing caused by the undersampling is generated using a difference in sensitivity caused by the physical arrangement of the coils.

The following describes a procedure of sensitivity encoding (SENSE), which is one form of the parallel imaging. Information on a sensitivity distribution of each coil is preliminarily acquired by a preparation scan, for example. The MRI apparatus, then, performs Fourier transform using the undersampled k-space data of the respective coils obtained by image scan, so as to form the MR images in relation to the respective coils. Thereafter, the MRI apparatus estimates a true MR image on the basis of a premise that "the MR images in relation to the respective coils are obtained by adding a product of the true MR image and the sensitivity distribution of the coil, as many as folding positions".

In k-t SENSE, which is one form of the extended SENSE, processing to remove aliasing is performed by the SENSE in a space where Fourier transform is applied to the time-series MR images in the temporal axis direction, thus generating spectrum data from which aliasing is removed. A time-series MR data is then generated by applying inverse Fourier transform to the spectrum data from which aliasing is removed. The Fourier transform is an example of a process of transforming data to be transformed, under the assumption that the data to be transformed are periodically arranged.

In the parallel imaging, a value obtained by dividing the number of samples in the full sampling by the number of samples in the undersampling is called a reduction factor R.

A method of applying Fourier transform in the temporal axis direction as the k-t SENSE (hereinafter, referred to as a temporal/spatial reconstruction method) performs the transformation process, under the assumption that the time-series MR images are periodically arranged in the temporal axis direction. Thus, the time series k-space data such that the signal intensity of the corresponding MR image varies greatly between the beginning and the end in the temporal axis direction are first acquired. If it is assumed that the MR images (time-series MR images) corresponding to the acquired time-series k-space data are periodically arranged, there will be an area where the signal intensity varies greatly, in the MR images that are assumed to be periodically arranged. In such a case, the function representing the signal intensity of the MR images, which are assumed to be periodically arranged, does not have continuity. Hence, a specific artifact may be generated in the MR image to be generated, thereby reducing the reconstruction accuracy. An example of the time-series k-space data such that the signal intensity of the corresponding MR image varies greatly between the beginning and the end in the temporal axis direction may be time-series k-space data that, are acquired by perfusion imaging, inversion pulse, and others. The MR image corresponding to the k-space data is an MR image generated by performing the reconstruction process on the k-space data. For example, the function representing the signal intensity described above is a function in which the input value is the acquisition time or the acquisition sequence of the pieces of k-space data, and the output value is the signal intensity at the attention position in the MR image generated by performing the reconstruction process on the k-space data corresponding to the input value.

Thus, in the present embodiment, if it is assumed that the MR images are periodically arranged, k-space data is added to the pieces of k-space data the corresponding function of which does not have continuity, so as to cause the function to have continuity. Thus, it is possible to prevent the occurrence of an artifact and the reduction of the reconstruction accuracy, when the temporal/spatial reconstruction method is applied.

In the following embodiment, an "x-space" is a hydrogen distribution image space (in the embodiment, images taken from objects other than hydrogen atoms are also called hydrogen distribution images for convenience sake), and "x-space data" is a set of signal points in the x space. Different signal points in the x-space correspond to signal points at different positions in the x-space. For example, a three-dimensional hydrogen distribution image of a brain is the three-dimensional x-space data. A two-dimensional x-space image taken from a certain cross section of a heart is the two-dimensional x-space data.

In addition, "k-t space data" is the time-series k-space data. By applying Fourier transform to the k-t space data in the spatial direction, the time-series x-space data (x-t space data) is obtained. By applying Fourier transform to the time-series x-space data in the temporal axis direction, x-f space data is obtained. That is, the x-f space data is the data in which the x space data is expressed by coefficient values after Fourier transform. The position of each signal point in the x-f space data is determined when the position of the signal point on the x axis and the position of the signal point on the f axis are determined. The "f" corresponds to frequency.

In the following embodiment, the generation function 122b obtains the x-f space data of each channel by applying Fourier transform to the k-t space data of each channel in the spatial direction and applying Fourier transform to the k-t space data of each channel in the temporal axis direction. The generation function 122b obtains one piece of x-f space data having no aliasing by the unfolding using the pieces of x-f space data corresponding to the number of channels and the pieces of sensitivity distribution information corresponding to the number of channels. The generation function 122b applies inverse Fourier transform, in the temporal axis direction, to the x-f space data, thereby generating the x-t space data (a hydrogen distribution image). In the following description, the pieces of x-f space data corresponding to the number of channels are called "x-f space data before the unfolding" and one piece of x-f space data obtained after the unfolding is called "x-f space data after the unfolding" for discriminating them from each other in some cases.

The following describes the unfolding processing in sensitivity encoding (SENSE). The positions of signal points in an image after the unfolding are expressed as $p=1, \ldots, n_p$ and the sampling is performed in the k-space at $n_p$ signal point intervals. In an image generated from the k-space data obtained by each coil by Fourier transform (or inverse Fourier transform), fold signals are overlapped. In the SENSE, when the sensitivity of each coil is already known, an unfolded image $z(p)$ is reproduced from the folded images. In the following description, both of the Fourier transform and the inverse Fourier transform are called Fourier transform.

By applying Fourier transform to the k-space data after the sampling at $n_p$ signal point intervals, folded images are obtained in which $n_p$ signal points are overlapped. In the SENSE, attention is paid to a process in which a specific signal point is generated in the folded image. With regard to the attention signal point in the folded image, the following equation (1) holds for each coil.

$$\rho(c) = \sum_{p=1}^{n_p} S(c, p)z(p) \qquad (1)$$

where respective coils are expressed as $c=1, \ldots, n_c$, $\rho(c)$ is the signal point value in the folded image of each coil, $z(p)$ is the corresponding signal value in the unfolded image, and $S(c,p)$ is the sensitivity of each coil with respect to the unfolded image.

When the sensitivity of each coil is already known, the number $n_c$ of equations having $n_p$ unknown variables $z(p)$ is obtained from equation (1). The $n_c$ is the number of coils. A linear system including $n_c$ equations (1) is expressed as $\rho=Sz$ in a matrix notation. Taking into consideration a noise covariance matrix $\Psi$ of the coil, $z$ can be estimated by equation (2).

$$z=(S^*\Psi^{-1}S)^{-1}S^*\Psi^{-1}\rho \qquad (2)$$

In the following embodiment, the processing to estimate $z$ from $\rho$ is called "unfolding". It is known that a signal to noise ratio (SNR) of the image obtained by performing Fourier transform and the unfolding to the k-space data acquired by the sampling at $n_p$ signal point intervals is expressed by equation (3) using the SNR of the image generated from the k-space data acquired by the full sampling without undersampling, the signal point interval $n_p$, and a g-factor ($g_p$).

$$SNR_p^{SENSE} = \frac{SNR_p^{full}}{g_p\sqrt{n_p}} \qquad (3)$$

The SNR is a value obtained by dividing the variance of signal by the variance of noise. A larger value of the SNR leads to smaller noise. A smaller value of the SNR leads to larger noise. The g-factor satisfies equation (4) and has a numerical value equal to or larger than one.

$$g_p = \sqrt{[(S^*\Psi^{-1}S)^{-1}]_{p,p}(S^*\Psi^{-1}S)_{p,p}} \qquad (4)$$

In this case, the signal point interval $n_p$ is equal to the reduction factor R. The reduction factor R is the ratio of the amount of data acquired by the full sampling to the amount of data acquired by the undersampling.

When the MR image is reconstructed from the time-series k-space data, it is known that the use of k-t SENSE can reconstruct an image with higher quality than that by the SENSE. In the k-t SENSE, the x-f space data is calculated by applying Fourier transform to the k-space data not only in the spatial direction but also in the temporal axis direction, and the unfolding is performed in the x-f space. The x of the x-f space represents the spatial direction. The f of the x-f space represents the other axis direction in the space after the transformation. The other axis is a result of the transformation performed in the temporal direction and described as the time-transformed axis.

The following describes a processing procedure in the first embodiment.

Figure 2:
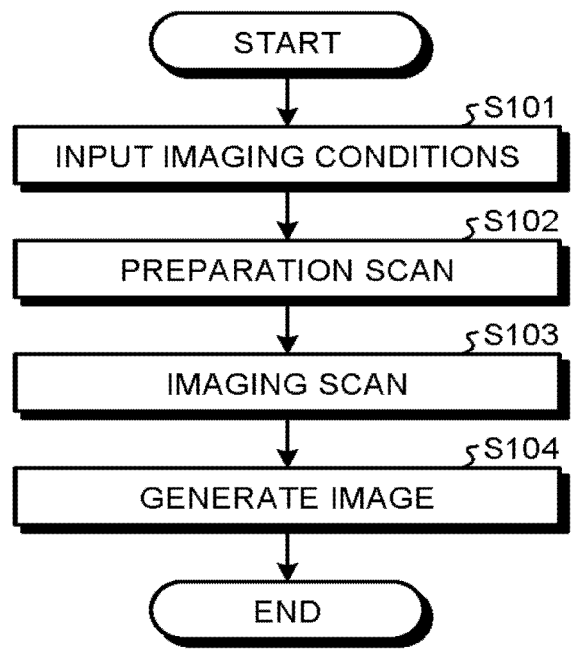
FIG. 2 is a flowchart illustrating a processing procedure in the first embodiment.

FIG. 2 is a flowchart illustrating a processing procedure in the first embodiment. The acquisition function 126a receives input of imaging conditions from an operator (step S101). The acquisition function 126a produces the sequence information on the basis of the imaging conditions input from the operator and transmits the produced sequence information to the sequence control circuitry 110, which controls the implementation of the preparation scan (step S102). Examples of the preparation scan include a scan to acquire an image for positioning, a shimming scan to correct non-uniformity in a magnetostatic field, and a scan to acquire the sensitivity distribution information.

After the completion of the preparation scan, the acquisition function 126a produces the sequence information on the basis of the imaging conditions input by the operator and transmits the produced sequence information to the sequence control circuitry 110, which controls the implementation of the imaging scan that acquires an output image (e.g., an image output for diagnosing) (step S103). In the first embodiment, the acquisition function 126a acquires the time-series k-space data of the single or the multiple channels in the imaging scan.

Figure 3:
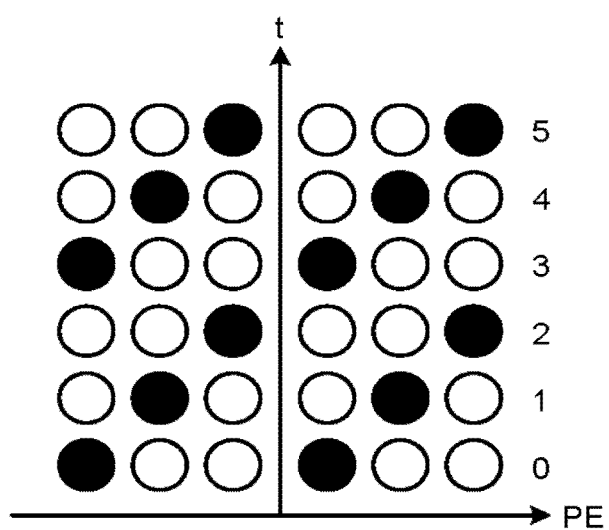
FIG. 3 is a schematic diagram explaining sampling positions according to the first embodiment.

In the first embodiment, the sequence control circuitry 110 acquires the time-series k-space data by the undersampling in accordance with the reduction factor R (reduction factor of sampling data relative to the full sampling data). The number of pieces of time-series k-space data acquired by the sequence control circuitry 110 is one Rth of that in the full sampling. Specifically, the sequence control circuitry 110 acquires the following number of signal points as the k-space data. The number is obtained by the following equation of "the number of signal points in a read out (RO) direction×the number of signal points in a phase encoding (PE) direction×the number of frames in the temporal direction/R×the number of channels". FIG. 3 is a schematic diagram explaining sampling positions according to the first embodiment. For example, as illustrated in FIG. 3, the sequence control circuitry 110 acquires the time-series space data, while shifting the sampling positions in the PE direction. In FIG. 3, the filled circles indicate the positions where the sampling is performed, and in this example, R=3.

The Image generation circuitry 122 generates an MR image using the time-series k-space data of the channels stored in the storage unit 123 at step S103 (step S104). The generated MR image is stored in the storage unit 123 or displayed on the display 125 as necessary. In this example, steps S101 to S103 are implemented when the processing circuitry 126 reads out the computer program corresponding to the acquisition function 126a from the storage circuitry 123, and executes the computer program being read out.

Figure 4:
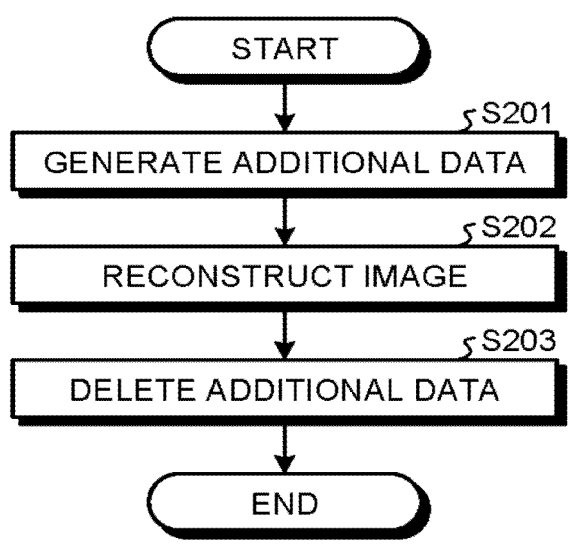
FIG. 4 is a flowchart illustrating a processing procedure of the image generation at step S104 according to the first embodiment.

FIG. 4 is a flowchart illustrating a processing procedure at step S104 according to the first embodiment.

A process to be executed by the data addition function 122a at step S201 will now be described. The data addition function 122a generates additional k-space data that is to be added to acquired k-space data, based on the pieces of acquired k-space data, which are the pieces of k-space data acquired by the acquisition function 126a. The data addition function 122a then adds the pieces of additional k-space data to the pieces of acquired k-space data. The pieces of acquired k-space data added with the pieces of additional k-space data are then generated as pieces of k-space data for reconstruction, which are pieces of k-space data used for reconstruction. In other words, the data addition function 122a generates a k-space data group for reconstruction including a acquired k-space data group and an additional k-space data group, by adding the additional k-space data group that is arranged in a range adjacent to a range in which the acquired k-space data group is arranged, to the acquired k-space data group. The data addition function 122a then delivers the generated pieces of k-space data for reconstruction (k-space data group for reconstruction) to the generation function 122b. Step S201 is implemented when the image generation circuitry 122 reads out the computer program corresponding to the data addition function 122a from the storage circuitry 123, and executes the computer program being read out.

Figure 5:
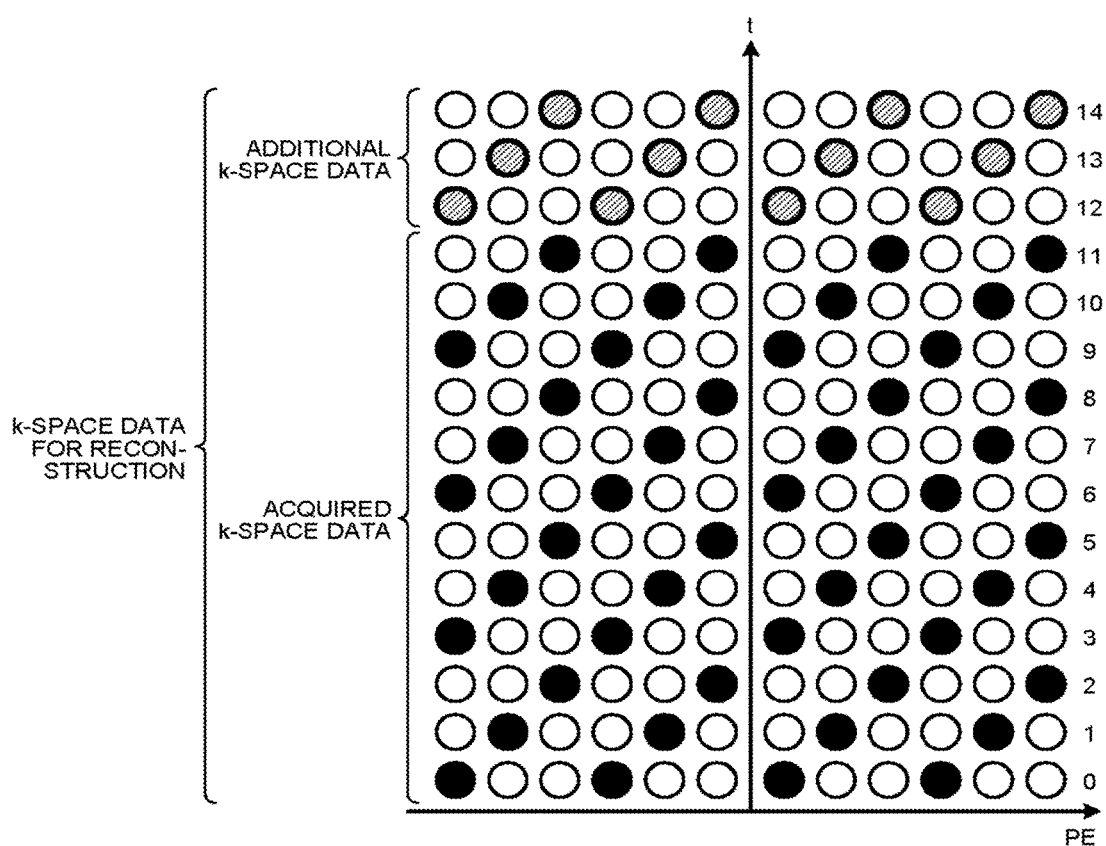
FIG. 5 is a schematic diagram explaining k-space data for reconstruction according to the first embodiment.

For example, each of the pieces of acquired k-space data is time-series data that has each of the axes in the RO direction in the k-space, the PE direction in the k-space, and the temporal direction. In other words, the acquired k-space data group is a data group that has been undersampled along at least one of the axes in the k-space (axis in the RO direction and the axis in the PE direction) as well as in the axis (temporal axis) different from the k-space axis. The number of the acquired k-space data is as many as the number of channels. The pieces of additional k-space data are pieces of k-space data relevant to the time preceding and subsequent to the pieces of acquired k-space data having been the time-series data. FIG. 5 is a schematic diagram explaining k-space data for reconstruction according to first embodiment. In the following explanation, as illustrated in the example of FIG. 5, the data addition function 122a adds the pieces of additional k-space data only to a position subsequent to the pieces of acquired k-space data in the temporal axis direction. However, the data addition function 122a may also add the pieces of additional k-space data only to a position preceding the pieces of acquired k-space data in the temporal axis direction, or may add the pieces of additional k-space data to positions both preceding and subsequent to the pieces of acquired k-space data in the temporal axis direction. The number of frames generated for the pieces of additional k-space data is a multiple of R as well as equal to or more than an R-frame. The additional k-space data is the undersampled data acquired by the same method as that of the acquired k-space data.

The data addition function 122a adds the pieces of additional k-space data arranged in a certain range adjacent to a certain range in which the pieces of acquired k-space data are arranged in the temporal axis direction, to the pieces of acquired k-space data arranged in the range in the temporal axis direction. The pieces of additional k-space data are added to the pieces of acquired k-space data, so that the function representing the signal intensity of the MR images corresponding to the k-space data for reconstruction, when the pieces of k-space data for reconstruction including the pieces of acquired k-space data and the pieces of additional k-space data are periodically arranged, will have continuity. In other words, the data addition function 122a adds the pieces of additional k-space data to the pieces of acquired k-space data, so that the function representing the signal intensity of the MR images corresponding to the k-space data for reconstruction will have continuity. At this time, the k-space data for reconstruction are arranged in the direction toward which the range in which the pieces of acquired k-space data are arranged, and the range in which the pieces of acquired k-space data are arranged. In this manner, the data addition function 122a adds the additional k-space data group, so that the signal intensity of the MR image group corresponding to the k-space data group for reconstruction has continuity. The data addition function 122a also adds the additional k-space data group based on the acquired k-space data group.

The acquired k-space data is an example of first data and first k-space data. The additional k-space data is an example of second data and second k-space data. The k-space data for reconstruction is an example of third data and third k-space data. The range in which the pieces of acquired k-space data (acquired k-space data group) are arranged is an example of a first range. The range in which the pieces of additional k-space data (additional k-space data group) are arranged is an example of a second range.

For example, in the example of FIG. 5, the data addition function 122a adds the pieces of additional k-space data that are arranged in a range of time 12 to 14 adjacent to a range of time 0 to 11 in the temporal axis direction, to the pieces of acquired k-space data that are arranged in the range of time 0 to 11 in the temporal axis direction. At this time, the data addition function 122a adds the pieces of additional k-space data to the pieces of acquired k-space data, so that the function representing the signal intensity of the MR images corresponding to the k-space data for reconstruction, when the pieces of k-space data for reconstruction in the range of time 0 to 14 are periodically arranged in the temporal axis direction, will have continuity. In this example, each of the time 0, 1, . . . , 14 corresponds to one frame. In other words, an MR image is generated based on the k-space data sampled at each time.

Figure 6:
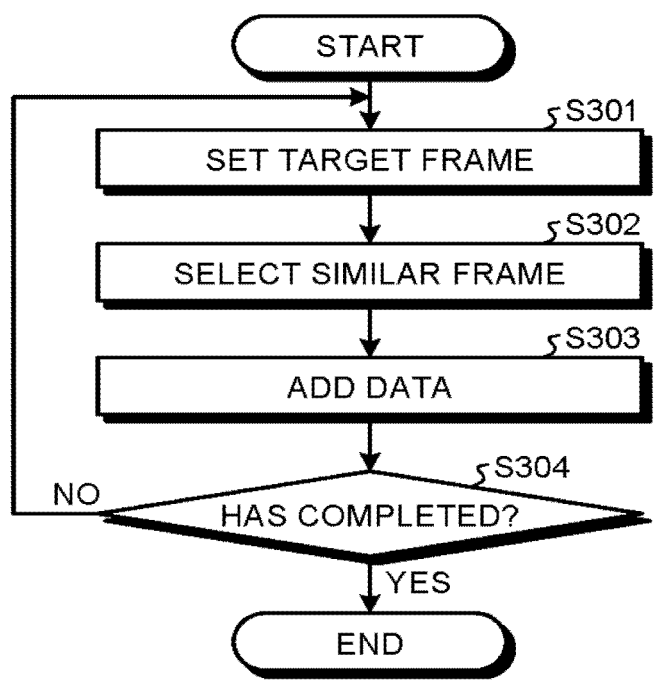
FIG. 6 is a flowchart illustrating a detailed processing procedure at step S201 according to the first embodiment.

FIG. 6 is a flowchart illustrating a detailed processing procedure at step S201 according to the first embodiment. Step S301 to step S303 are executed on each of the frames of the additional k-space data.

First, the data addition function 122a sets the target frame (step S301). To cause the function above to have the continuity above, the addition function 122a sets the target frame relative to the frame of the temporally earliest additional k-space data (temporally first frame) among the pieces of additional k-space data, to be the signal intensity of the MR image corresponding to the frame of the temporally closest acquired k-space data when continuity is taken into consideration, in other words, the frame of the latest acquired k-space data (temporally last frame) among the pieces of acquired k-space data. For example, in the example of FIG. 5, the data addition function 122a sets the signal intensity of the frame of the acquired k-space data at the time 11, to be the target frame relative to the time 12 that is the frame of the temporally earliest additional k-space data among the pieces of additional k-space data. To cause the function above to have the continuity above, the data addition function 122a may also set the target frame relative to the frame of the temporally earliest additional k-space data among the pieces of additional k-space data, to be the frame of the temporally closest acquired k-space data when continuity is taken into consideration, in other words, the frame of the latest acquired k-space data (temporally last frame) among the pieces of acquired k-space data. For example, in the example of FIG. 5, the data addition function 122a may set the frame of the acquired k-space data at the time 11 to be the target frame relative to the time 12 that is the frame of the temporally earliest, additional k-space data among the pieces of additional k-space data.

The data addition function 122a also sets the target frame relative to the frame of the temporally latest additional k-space data among the pieces of additional k-space data, to be the signal intensity of the frame of the temporally earliest acquired k-space data among the pieces of acquired k-space data. For example, in the example of FIG. 5, the data addition function 122a sets the signal intensity of the frame of the acquired k-space data at the time 0, to be the target frame relative to the time 14 that is the frame of the temporally last additional k-space data among the pieces of additional k-space data. The data addition function 122a may also set the target frame relative to the frame of the temporally latest additional k-space data among the pieces of additional k-space data, to be the frame of the temporally earliest acquired k-space data among the pieces of acquired k-space data. For example, in the example of FIG. 5, the data addition function 122a may set the frame of the acquired k-space data at the time 0, to be the target frame relative to the time 14 that is the frame of the temporally last additional k-space data among the pieces of additional k-space data.

The data addition function 122a sets the signal intensity calculated by performing a predetermined weighted addition, to be the target frame of the frame of the additional k-space data that is positioned between the temporally first and temporally last additional k-space data, among the pieces of additional k-space data. The signal intensity is calculated by performing a predetermined weighted addition on the signal intensity of the MR image corresponding to the target frame having been set as the frame of the temporally first additional k-space data among the pieces of additional k-space data, and the signal intensity of the MR image corresponding to the target frame having been set as the frame of the temporally last additional k-space data. For example, the data addition function 122a calculates the weight based on the respective temporal distances between the frame of the additional k-space data that is positioned between the temporally first additional k-space data and the temporally last additional k-space data among the pieces of additional k-space data, and the frame of the first additional k-space data as well as the frame of the last additional k-space data. For example, the data addition function 122a reduces the weight with an increase in the distance, and increases the weight with a decrease in the distance. The data addition function 122a calculates the signal intensity of the MR image corresponding to the frame of the additional k-space data that is positioned between the temporally first additional k-space data and the temporally last additional k-space data among the pieces of additional k-space data, by performing the predetermined weighted addition described above using the calculated weight. The data addition function 122a then sets the calculated signal intensity to be the target frame.

In the example of FIG. 5, the data addition function 122a calculates the target frame relative to the time 13, by performing a predetermined weighted addition on the signal intensity of the frame of the acquired k-space data at the time 11 that is the target frame of the frame of the additional k-space data at the time 12, and the signal intensity of the frame of the acquired k-space data at the time 0 that is the target frame of the frame of the additional k-space data at the time 14. The data addition function 122a may also calculate the frame of the additional k-space data that is positioned between the temporally first additional k-space data and the temporally last additional k-space data among the pieces of additional k-space data. The frame of the additional k-space data is calculated by performing a weighed addition on the target frame having been set as the frame of the first additional k-space data and the target frame having been set as the last additional k-space data, using the calculated weight. The data addition function 122a can then set the calculated frame to be the target frame.

Next, the data addition function 122a selects the frame having the signal intensity similar to that of the target frame set at step S301, from the frames of the pieces of acquired k-space data, to be a similar frame (step S302).

As illustrated in the example of FIG. 5, a sampling pattern (may be referred to as an undersampling pattern) is uniquely determined for each of the frames of the pieces of additional k-space data, based on time. Thus, the data addition function 122a searches for a frame similar to the target frame at each time, from the frames of the pieces of acquired k-space data that are acquired using the sampling pattern corresponding to each time of the pieces of additional k-space data. During this time, it is difficult to calculate the similarity between the pieces of k-space data that are undersampled using different sampling patterns. Thus, the data addition function 122a performs inverse Fourier transform on all the channel data of the frames (including the target frame) to be transformed into x-space, and calculates the similarity using the absolute value of the coefficient value after being transformed. When the inverse Fourier transform is applied to the undersampled data, folding occurs on the x-space data. Thus, the data addition function 122a calculates the similarity using the x-space data with folding. For example, the data addition function 122a calculates the similarity using the similarity calculating method such as the Sum of Absolute Difference (SAD) and the Sum of Squared Difference (SSD). For example, the data addition function 122a selects the frame having the highest similarity (the smallest SAD and SSD) to be the similar frame.

Next, the data addition function 122a adds the additional k-space data to the acquired k-space data, by copying the acquired k-space data of the similar frame selected at step S302 to the frame of the additional k-space data (step S303).

The data addition function 122a then determines whether the generation of frames for all the additional k-space data has completed (step S304). If the generation of frames for all the additional k-space data has not yet completed (No at step S304), the data addition function 122a returns to step S301. If the generation of frames for all the additional k-space data has completed (Yes at step S304), the data addition function 122a delivers the pieces of acquired k-space data to which the pieces of additional k-space data are added, to the generation function 122b, as the pieces of k-space data for reconstruction. The data addition function 122a then proceeds to S202. In this example, steps S301 to S304 are implemented when the image generation circuitry 122 reads out the computer program corresponding to the data addition function 122a from the storage circuitry 123, and executes the computer program being read out.

Figure 7:
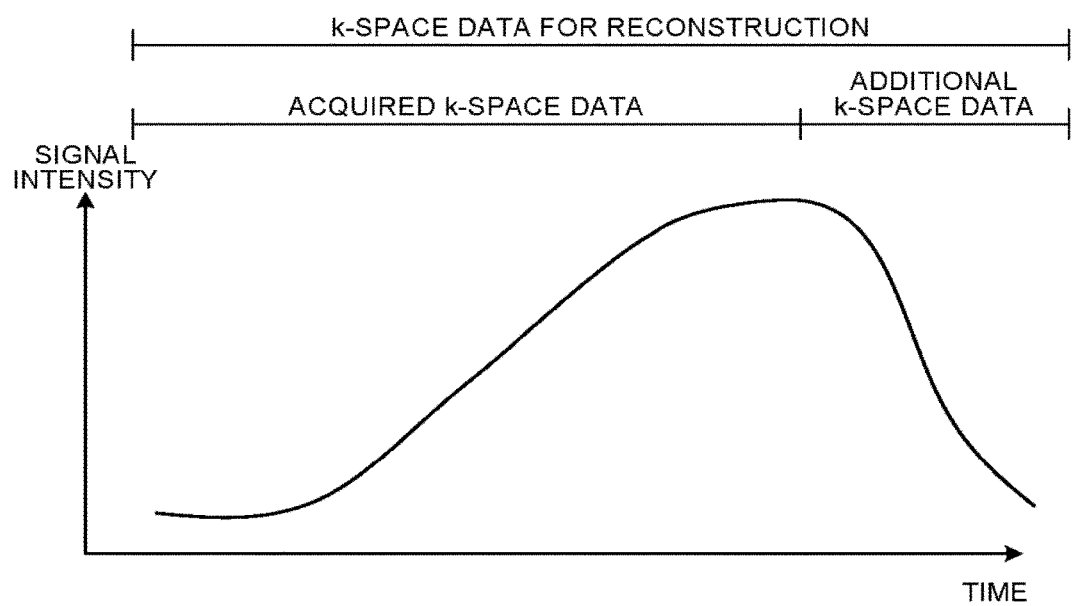
FIG. 7 is a diagram explaining signal intensity of an MR image corresponding to the k-space data for reconstruction according to the first embodiment.

FIG. 7 is a diagram explaining signal intensity of an MR image corresponding to the k-space data for reconstruction according to the first embodiment. As illustrated in FIG. 7, when the processes at steps S301 to S303 are performed to add the pieces of additional k-space data to the pieces of acquired k-space data, the difference between the signal intensity at both ends of the MR images corresponding to the pieces of k-space data for reconstruction is reduced in the temporal axis direction. Thus, the function representing the signal intensity of the MR images corresponding to the pieces of k-space data for reconstruction, when the k-space data for reconstruction are periodically arranged, will have continuity in the temporal axis direction.

At steps S301 to S303, the data addition function 122a sets the target frame for the frame closest to the range in which the pieces of acquired k-space are arranged (hereinafter referred to as an adjacent frame) among the frames of the pieces of additional k-space data that are to be generated. The data addition function 122a sets the frame closest to the adjacent frame (for example, the frame of the additional k-space data closest to the adjacent frame or the signal intensity of the MR image corresponding to the frame of the additional k-space data that is closest to the adjacent frame) among the frames of the pieces of acquired k-space data, to be the target frame. The data addition function 122a then generates a frame similar to the target frame, for the signal intensity of the corresponding MR image, among the frames of the pieces of acquired k-space data acquired by the sampling pattern corresponding to the adjacent frame, to be the adjacent frame. The frame of the acquired k-space data is an example of a first frame. The frame of the additional k-space data is an example of a second frame.

Also, at steps S301 to S303, the data addition function 122a sets the target frame for the frame furthest from the range in which the pieces of acquired k-space data are arranged (hereinafter, referred to as a distant frame), among the frames of the pieces of additional k-space data that are to be generated. The data addition function 122a sets a frame furthest from the distant frame (for example, the frame of additional k-space data furthest from the distant frame, or the signal intensity of the MR image corresponding to the frame of the additional k-space data that is furthest from the distant frame), among the frames of the pieces of acquired k-space data, to be the target frame. The data addition function 122a then generates a frame similar to the target frame, for the signal intensity of the corresponding MR image, among the frames of the pieces of acquired k-space data acquired using the sampling pattern corresponding to the distant frame, to be the distant frame.

Also at steps S301 to S303, the data addition function 122a calculates signal intensity of the frame excluding the adjacent frame and the distant frame, among the frames of the pieces of additional k-space data, based on the signal intensity of the MR image corresponding to the target frame of the adjacent frame as well as the signal intensity of the MR image corresponding to the target frame of the distant frame. Consequently, the data addition function 122a generates a frame excluding the adjacent frame and the distant frame.

At step S302, the data addition function 122a also calculates the similarity with each of image space (may be referred to as target image space) obtained by applying Fourier transform to the target frame, and image space (hereinafter, referred to as candidate image space) obtained by applying Fourier transform to each of the frames of the pieces of acquired k-space data that are acquired by the sampling pattern corresponding to the adjacent frame or distant frame. The data addition function 122a then generates a frame of the acquired k-space data corresponding to the candidate image space having the highest similarity based on the calculated similarity, to be the adjacent frame or the distant frame. The target image space is an example of first image space. The candidate image space is an example of second image space.

The description returns to FIG. 4. A process to be executed by the generation function 122b at step S202 will now be described. The generation function 122b performs a reconstruction process on the pieces of k-space data for reconstruction, and generates MR images. For example, when the pieces of k-space data for reconstruction are delivered from the data addition function 122a, the generation function 122b performs inverse Fourier transform on the pieces of k-space data for reconstruction in the temporal/spatial direction, and acquires the x-f space data before unfolding. The generation function 122b then unfolds the x-f space data before unfolding, and generates the x-f space data after unfolding. The generation function 122b then applies Fourier transform to the x-f space data after unfolding in the temporal axis direction, to obtain x-t space data. The generation function 122b then delivers the x-t space data to the deletion function 122c. The x-t space data is data indicating the MR images along the time series.

The Fourier transform and the inverse Fourier transform are transformation processes to be performed to the data to be transformed, under the assumption that the data to be transformed are periodically arranged. In other words, at step S202, the generation function 122b generates time-series MR images from the k-space data for reconstruction, by performing the transformation process on the data to be transformed, under the assumption that the data to be transformed are periodically arranged. In this example, when the pieces of k-space data for reconstruction are periodically arranged, the function representing the signal intensity of the MR image corresponding to the k-space data for reconstruction has continuity. Thus, at step S202, it is possible to prevent the occurrence of an artifact specific to the inverse Fourier transform, on the generated MR image.

The deletion function 122c makes the number of frames of the x-t space data equal to the number of frames of the pieces of acquired k-space data, by deleting the data relevant to the time of the pieces of additional k-space data that are added to the pieces of acquired k-space data at step S201, from the x-t space data (step S203). The deletion function 122c then finishes the process. For example, in the example of FIG. 5, the deletion function 122c deletes the data relevant to the time 12 to 14 of the pieces of additional k-space data from the x-t space data, and makes the number of frames of the x-t space data equal to the number of frames of the pieces of acquired k-space data.

In other words, at step S203, the deletion function 122c deletes the MR image corresponding to the range in which the additional k-space data are arranged, from the MR images indicated by the x-t space data generated by the generation function 122b. Hence, it is possible to obtain the number of frames of the MR images generated only from the acquired k-space data.

According to the first embodiment, even if the function representing the signal intensity of the MR images corresponding to the pieces of acquired k-space data, when the acquired k-space data are periodically arranged, does not have continuity, the pieces of additional k-space data are added, so that the function representing the signal intensity of the MR images corresponding to the pieces of k-space data for reconstruction, when the pieces of k-space data for reconstruction are periodically arranged, will have continuity. Consequently, according to the first embodiment, it is possible to prevent the occurrence of a specific artifact that may be generated when a process of transformation, such as the temporal/spatial reconstruction method, is performed under the assumption that the data to be transformed are periodically arranged. As a result, it is possible to prevent the reduction in reconstruction accuracy.

First Modification of the First Embodiment: Limiting the Search Area of the Similar Frame To select the similar frame at step S302, the data addition function 122a may limit, the search target to a part of the frames of the pieces of acquired k-space data, instead of making all the frames of the pieces of acquired k-space data the search target. For example, to select a similar frame that is similar to the adjacent frame, the data addition function 122a limits the search target to the last quarter of the frames in the temporal axis direction, among all the frames. Also, to select, a similar frame that is similar to the distant frame, the data addition function 122a limits the search target to the first quarter of the frames in the temporal axis direction, among all the frames. Also, to select a similar frame that is similar to the frame between the adjacent frame and the distant frame, the data addition function 122a limits the search target to the frames excluding the last quarter of the frames and the first quarter of the frames in the temporal axis direction, among all the frames. Consequently, it is possible to reduce the search time.

Second Modification of the First Embodiment: Calculating the Similarity Using the k-Space Data To calculate the similarity at step S302, the data addition function 122a may calculate the similarity using the k-space data without undersampling that is generated by interpolating the undersampled k-space data, instead of calculating the similarity using the x-space with the folding.

Third Modification of the First Embodiment: Not Performing the Search Process

To set the target frame at step S301, the data addition function 122a may select a frame that is temporally closest to the target frame among the pieces of acquired k-space data having the same sampling pattern as the sampling pattern of the frame of the additional k-space data. In this case, the data addition function 122a does not select the similar frame at step S302, but at step S303, the data addition function 122a copies the k-space data of the target frame set at step S301. Because the search process will not be performed, it is possible to reduce the processing time.

Instead of selecting a single similar frame at step S302, the data addition function 122a may generate additional k-space data by performing a weighted addition on the frame of the pieces of acquired k-space data that is acquired by the same sampling pattern as the sampling pattern of the frame of the additional k-space data (hereinafter, referred to as a same pattern frame). For example, the data addition function 122a calculates a feature amount indicating the signal intensity of the corresponding MR image, of the target frame and each of all the same pattern frames. The data addition function 122a then calculates the weight using the absolute value of the difference between the feature amount of the target frame and the feature amount of the same pattern frame. For example, if the difference between the feature amount of the target frame and the feature amount of the same pattern frame is small, the data addition function 122a increases the weight. If the difference between the feature amount of the target frame and the feature amount of the same pattern frame is large, the data addition function 122a reduces the weight. For example, the feature amount of the signal intensity may also be an added value of the k-space data near the center frequency, or an added value of the signals of the x-space data obtained by performing the inverse Fourier transform. If the feature amount calculated from the target frame is larger than the maximum value of the feature amount calculated from the same pattern frame, or if the feature amount calculated from the target frame is smaller than the minimum value of the feature amount calculated from the same pattern frame, the data addition function 122a may copy the same pattern frame that takes the maximum value or the minimum value. Because the search process will not be performed, it is possible to reduce the processing time.

Second Embodiment

Next, a second embodiment will be described. The second embodiment is different from the first embodiment in the processing contents of the processing circuitry and the image generation circuitry, and also in that the processing circuitry acquires the additional data. In the second embodiment, the same reference numerals denote the same components as those in the first embodiment, and the description thereof may be omitted.

In the first embodiment, the data addition function 122a generates the additional k-space data. In the second embodiment, a data addition function 226b acquires the additional k-space data.

Figure 8:
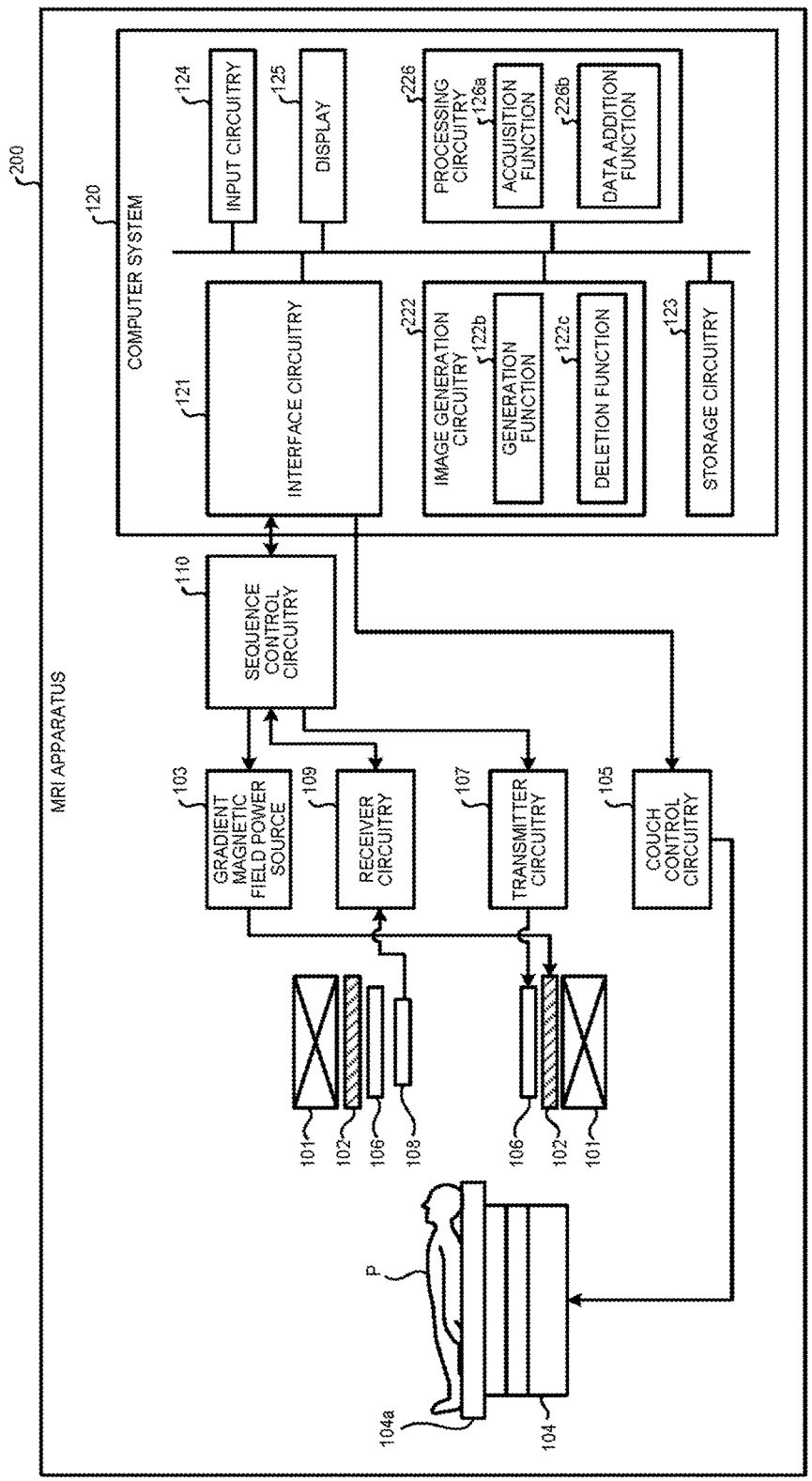
FIG. 8 is a functional block diagram illustrating a structure of an MRI apparatus according to a second embodiment.

FIG. B is a functional block diagram illustrating a structure of an MRI apparatus 200 according to a second embodiment. As illustrated in the example of FIG. 8, compared with the MRI apparatus 100 illustrated in FIG. 1, the MRI apparatus 200 is different from the MRI apparatus 100 in including processing circuitry 226 that has added the data addition function 226b anew and image generation circuitry 222 excluding the data addition function 122a.

The processing circuitry 226 acquires the time-series k-space data of the respective channels, while shifting the sampling positions in the spatial direction with the acquisition function 126a, and acquires the time-series k-space data using the same sampling method as that of the acquisition function 126a with the data addition function 226b.

The image generation circuitry 222 generates an image by using the data acquired by the processing circuitry 226 or the data acquired by the processing circuitry 226 to be stored in the storage circuitry 123. The processing content of the generation function 122b is the same as that in the first embodiment. The deletion function 122c deletes the unfolded data relative to the time corresponding to the pieces of additional k-space data that are added to the pieces of acquired k-space data by the data addition function 226b.

Figure 9:
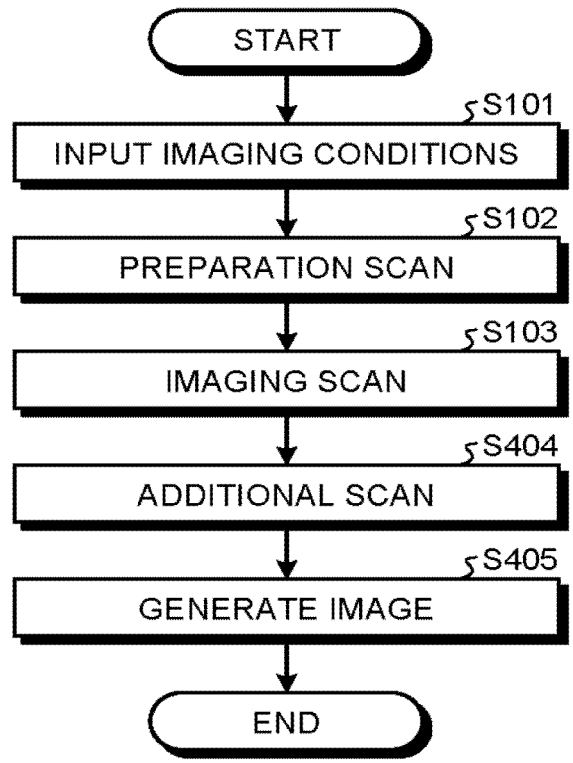
FIG. 9 is a flowchart illustrating a processing procedure in the second embodiment.

FIG. 9 is a flowchart illustrating a processing procedure in the second embodiment. Because the contents in steps S101 to S103 are the same as those in the first embodiment, the description thereof will be omitted.

The data addition function 226b acquires the pieces of additional k-space data, adds the pieces of additional k-space data to the pieces of acquired k-space data that are acquired at step S103, and obtains the pieces of k-space data for reconstruction (step S404). In other words, the data addition function 226b acquires the additional k-space data group in addition to the acquired k-space data group that are acquired by the acquisition function 126a. The data addition function 226b then adds the acquired additional k-space data group to the acquired k-space data group. At step S404, the data addition function 226b also delivers the obtained pieces of k-space data for reconstruction to the image generation circuitry 222, and stores the obtained pieces of k-space data for reconstruction in the storage circuitry 123. In this example, step S404 is implemented when the image generation circuitry 222 reads out the computer program corresponding to the data addition function 122a from the storage circuitry 123, and executes the computer program being read out.

For example, each of the pieces of additional k-space data that are acquired by the data addition function 226b is time-series data that has each of the axes in the RO direction in the k-space, the PE direction in the k-space, and the temporal direction. The number of the additional k-space data is as many as the number of channels. The additional k-space data is the undersampled data acquired by the same method as that of the acquired k-space data. The data addition function 226b may be executed at the same time as that of the acquisition function 126a, or may be executed at a different time such as before or after the acquisition function 126a is executed. The data addition function 226b adds the pieces of additional k-space data to a position preceding the pieces of acquired k-space data in the temporal axis, or to a position subsequent to the pieces of acquired k-space data in the temporal axis. The data addition function 226b may also add the pieces of additional k-space data to positions both preceding and subsequent to the pieces of acquired k-space data in the temporal axis. The number of the acquired frames of the pieces of additional k-space data is a multiple of R as well as equal to or more than an R-frame. When the signal changing state can be acquired at any time, the data addition function 226b acquires the first half of the additional k-space data in the temporal axis, at the same time when the frame subsequent to the pieces of acquired k-space data in the temporal direction is acquired. The data addition function 226b then acquires the latter half of the additional k-space data at the same time when the frame preceding the pieces of acquired k-space data in the temporal axis is acquired. By acquiring the pieces of additional k-space data in this manner, the function representing the signal intensity of the MR image corresponding to the k-space data for reconstruction, when the pieces of k-space data for reconstruction are periodically arranged, will have continuity in the temporal axis direction as illustrated in the previous example of FIG. 7. The pieces of k-space data for reconstruction are obtained by adding the pieces of additional k-space data to the pieces of acquired k-space data.

In this example, the sequence capable of acquiring signals at any time may be an inversion recovery pulse sequence capable of acquiring inversion time (TI) for a plurality of times, and optionally setting each TI, for example.

The generation function 122b generates MR images from the pieces of k-space data for reconstruction (step S405), and finishes the process. In this example, step S405 is implemented when the image generation circuitry reads out the computer program corresponding to the generation function 122b from the storage circuitry 123, and executes the computer program being read out.

Figure 10:
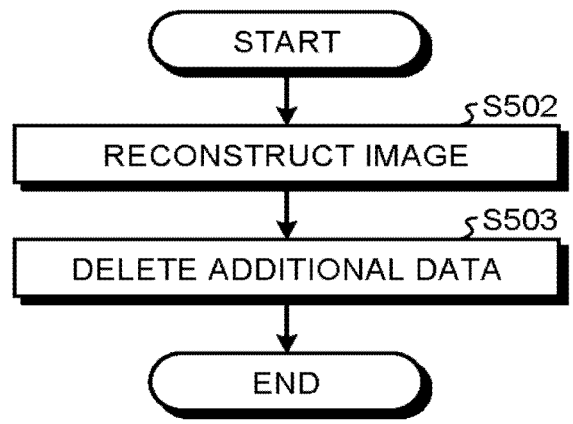
FIG. 10 is a flowchart illustrating a processing procedure at step S405 in the second embodiment.

FIG. 10 is a flowchart illustrating the processing procedure at step S405 in the second embodiment. A process to be executed by the generation function 122b at step S502 will now be described. The generation function 122b obtains x-f space data before unfolding, by performing the inverse Fourier transform on the pieces of k-space data for reconstruction having been delivered from the processing circuitry 226, in the temporal/spatial direction. The generation function 122b then unfolds the x-f space data before unfolding, to generate the x-f space data after unfolding. The generation function 122b further applies the Fourier transform on the x-f space data after unfolding in the temporal axis direction, and obtains the x-t space data. The generation function 122b then delivers the x-t space data to the deletion function 122c. The x-t space data is data indicating the MR images along the time-series.

The deletion function 122c deletes a part of the delivered x-t space data. For example, the deletion function 122c deletes the data relevant to the time of the pieces of additional k-space data added to the pieces of acquired k-space data at step S404 from the x-t space data, and makes the number of frames of the x-t space data equal to that of the acquired k-space data (step S503). In this example, step S502 is implemented when the image generation circuitry 222 reads out the computer program corresponding to the generation function 122b from the storage circuitry 123, and executes the computer program being read out. Also, step S503 is implemented when the image generation circuitry 222 reads out the computer program corresponding to the deletion function 122c from the storage circuitry 123, and executes the computer program being read out.

The second embodiment has been described above. With the MRI apparatus 200 according to the second embodiment, similar to the MRI apparatus 100 according to the first embodiment, it is possible to prevent the occurrence of a specific artifact that may be generated when the transformation process is performed, under the assumption that the data to be transformed are periodically arranged.

Modification of the Second Embodiment: Real-Time Acquisition

In the second embodiment, if the acquisition mode of the k-space data is real-time acquisition with which the signal changing state is successively acquired, it is not possible to acquire the signal changing state at any time. In this case, at step S404, the data addition function 226b acquires the signals relevant to the time preceding or subsequent to the pieces of acquired k-space data, as the pieces of additional k-space data. This means that the function representing the signal intensity of the MR images corresponding to the pieces of k-space data for reconstruction, when the k-space data for reconstruction are periodically arranged, may not have continuity in the temporal axis direction. However, it is possible to move the frame the reconstruction accuracy of which is reduced from the acquired k-space data.

Third Embodiment

Next, a third embodiment will be described. The third embodiment is different from the first embodiment and the second embodiment in the processing content of the image generation circuitry and in applying a window function to the k-space data for reconstruction. In the third embodiment, the same reference numerals denote the same components as those in the first embodiment and the second embodiment, and the description thereof may be omitted.

Figure 11:
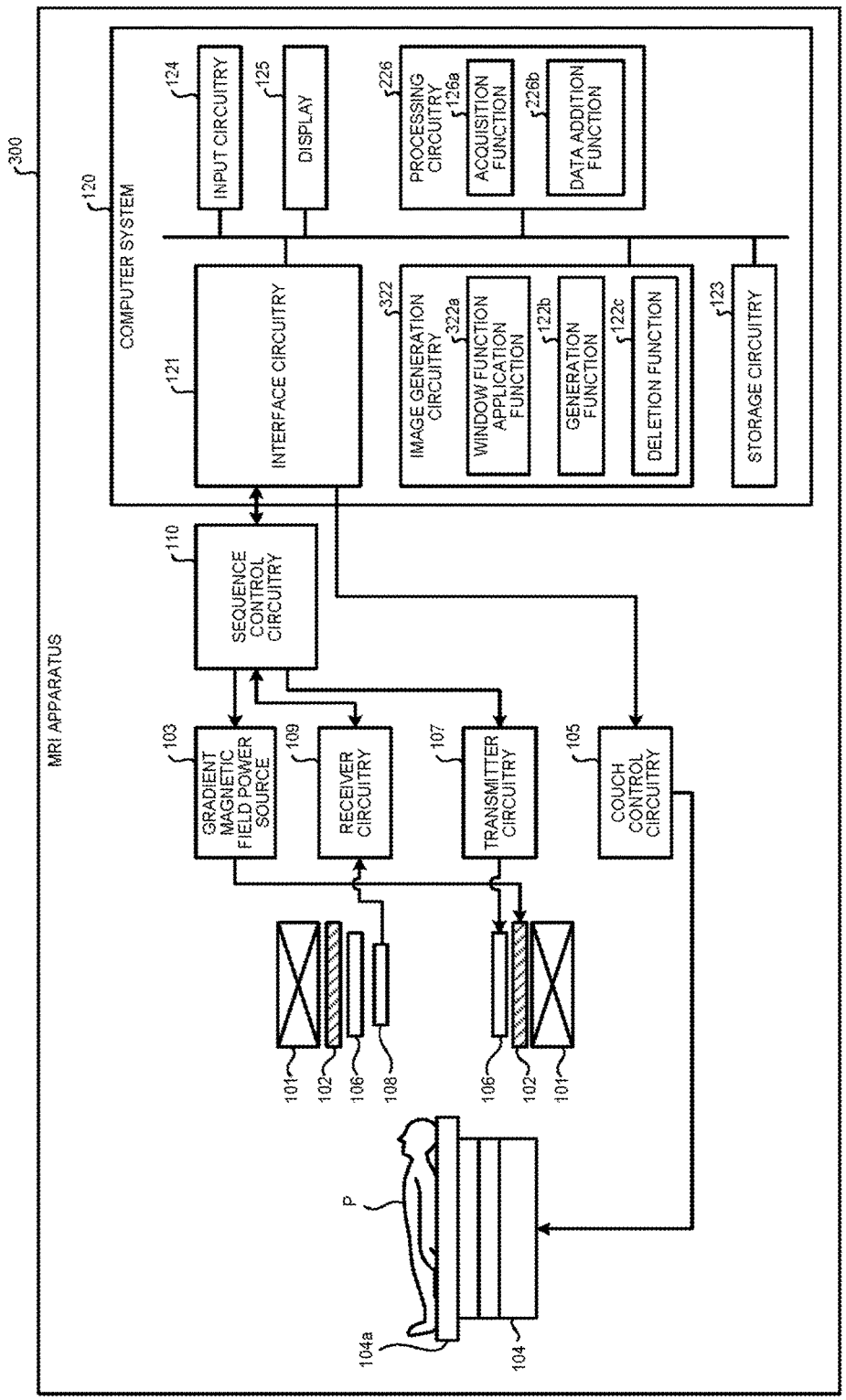
FIG. 11 is a functional block diagram illustrating a structure of an MRI apparatus according to a third embodiment.

FIG. 11 is a functional block diagram illustrating a structure of an MRI apparatus according to a third embodiment. The MRI apparatus according to the third embodiment is different from the MRI apparatus 200 illustrated in FIG. 8, in including a window function application function 322a anew.

The window function application function 322a applies a window function to the pieces of k-space data for reconstruction. For example, the window function is a filter that reduces the difference between the signal intensity of the MR images at both ends among the MR images corresponding to the pieces of k-space data for reconstruction, in the temporal axis direction. By applying such a filter to the pieces of k-space data for reconstruction, the function representing the signal intensity of the MR images corresponding to the pieces of k-space data for reconstruction, when the k-space data for reconstruction are periodically arranged, will have continuity.

Figure 12:
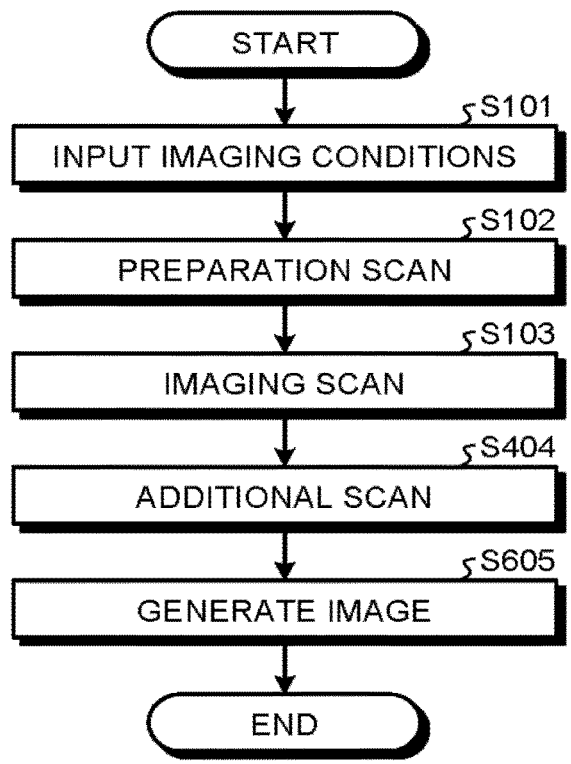
FIG. 12 is a flowchart illustrating a processing procedure in the third embodiment.

FIG. 12 is a flowchart illustrating a processing procedure in the third embodiment. Compared with the second embodiment (FIG. 9), the third embodiment is different from the second embodiment in executing a process at step S605 instead of step S405.

Figure 13:
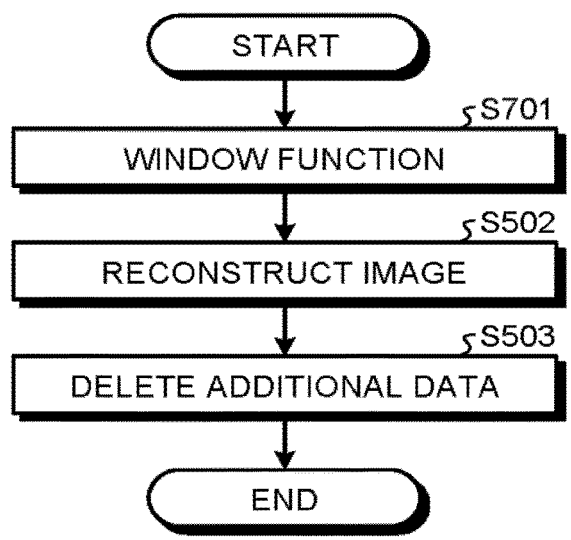
FIG. 13 is a flowchart illustrating an example of a processing flow at step S605.

FIG. 13 is a flowchart illustrating an example of a processing flow at step S605. As illustrated in the example of FIG. 13, the window function application function 322a applies a window function to the temporal axis of the pieces of k-space data for reconstruction. The window function application function 322a applies a window function so that the function representing the signal intensity of the MR images corresponding to the pieces of k-space data for reconstruction, when the k-space data for reconstruction are periodically arranged, will have continuity in the temporal axis direction (step S701). For example, the window function application function 322a may apply a window function such as a rectangular window so as to reduce the signals in the time bandwidth corresponding to the pieces of additional k-space data. Step S701 is implemented when image generation circuitry 322 reads out the computer program corresponding to the window function application function 322a from the storage circuitry 123, and executes the computer program being read out.

It is considered that the changes in the signal intensity of the MR images corresponding to the pieces of k-space data for reconstruction change according to the type of protocol to be executed. Thus, the window function corresponding to the signal change in each protocol may be stored in advance in the storage circuitry 123 for each type of protocol, and at step S605, the window function application function 322a may obtain the window function corresponding to the type of protocol being executed, and apply the obtained window function to the temporal axis of the pieces of k-space data for reconstruction.

According to the third embodiment, even if a desired continuity cannot be obtained by the data addition function 226b, it is possible to cause the function representing the signal intensity of the MR images corresponding to the pieces of k-space data for reconstruction, when the k-space data for reconstruction are periodically arranged, to have continuity in the temporal axis direction. Thus, according to the third embodiment, similar to the first embodiment and the second embodiment, it is possible to prevent the occurrence of a specific artifact that may be generated when the transformation process is performed, under the assumption that the data to be transformed are periodically arranged.

First Modification of the Third Embodiment: Application of a Window the Image Space The window function application function 322a may also apply the Fourier transform to the k-t space data of each channel of the k-space data for reconstruction in the spatial direction, obtain the x-t space data of each channel, and apply a window function to the x-t space data of each channel. In this case, the generation function 122b obtains the x-f space data of each channel, by applying the Fourier transform only in the temporal axis direction.

Second Modification of the Third Embodiment: Modification of the First Embodiment This MRI apparatus 300 illustrated in FIG. 11 is described as a modification of the MRI apparatus 200 according to the second embodiment. However, the MRI apparatus 300 may be a modification of the MRI apparatus 100 according to the first embodiment. In this case, the window function application function 322a generates the pieces additional k-space data with the data addition function 122a, and applies a window function to the pieces of k-space data for reconstruction, after the generated pieces of additional k-space data are added to the pieces of acquired k-space data. In this case, the window function may be applied to the pieces of Is-space data for reconstruction, after transforming the k-space data for reconstruction to the image space similar to that in the first modification.

In the embodiments described above, the data acquired by the acquisition function 126a is the time-series k-space data, in other words, the k-t space data. However, the data to be acquired is not limited thereto. For example, the MRI apparatus may acquire the k-space data in a desired sequence. In other words, the acquired k-space data group may be a data group that is undersampled along at least one of the axes (axis in the RO direction and the axis in the PE direction) in the k-space, as well as in any axis that is different from the axes in the k-space.

For example, the MRI apparatus may acquire the k-space data in a spatial sequence along the axis in the slicing direction. In this case, the generation function 122b reconstructs the MR image using a method for reconstructing an MR image that is called controlled aliasing in parallel imaging results in higher acceleration (CAIPI).

Also, for example, the MRI apparatus may acquire the k-space data in a sequence along the axis of a parameter p instead of the time t. The p referred here may be any axis. For example, the p includes a value b. The value b indicates the intensity of motion probing gradient (MPG) pulse to be applied to a subject when diffusion weighted imaging is performed. In the diffusion weighted imaging, the MPG pulses are applied a plurality of times while changing the value b.

Fourth Embodiment

An image processing apparatus connected to the MRI apparatus via a network may have the function of the MRI apparatus 100 according to the first embodiment, the function of the MRI apparatus 200 according to the second embodiment, or the function of the MRI apparatus 300 according to the third embodiment. Such an embodiment will be described as a fourth embodiment with reference to FIG. 14.

Figure 14:
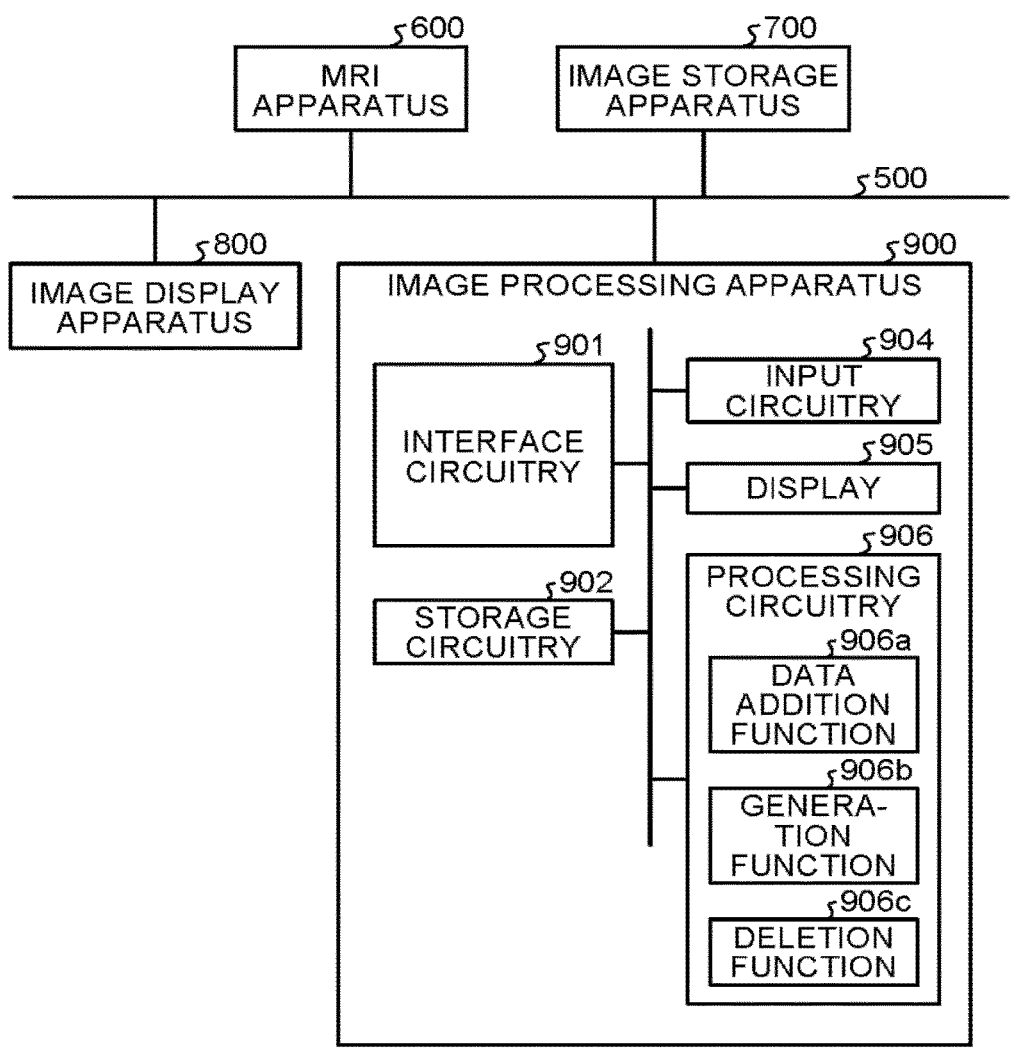
FIG. 14 is a functional block diagram illustrating a structure of an image processing apparatus according to a fourth embodiment.

FIG. 14 is a functional block diagram illustrating a structure of an image processing apparatus according to a fourth embodiment. The system illustrated in the example of FIG. 14 includes an MRI apparatus 600, an image storage apparatus 700, an image display apparatus 800, and an image processing apparatus 900. The MRI apparatus 600, the image storage apparatus 700, the image display apparatus 800, and the image processing apparatus 900 are communicable with each other directly or indirectly via an in-hospital local area network (LAN) 500 installed in a hospital. For example, if a picture archiving and communication system (PACS) has been installed, each of the apparatuses 600 to 900 mutually transmits and receives an image and others, in compliance with the digital imaging and communications in medicine (DICOM) standard.

The MRI apparatus 600 is the MRI apparatus 100 according to the first embodiment, the MRI apparatus 200 according the second embodiment, or the MRI apparatus 300 according to the third embodiment. For example, the MRI apparatus 600 transmits acquired k-space data and k-space data for reconstruction to the image processing apparatus 900.

The image storage apparatus 700 is database that stores therein the MR image reconstructed by the MRI apparatus 600 and the image processing apparatus 900.

The image processing apparatus 900 is a workstation. The image processing apparatus 900 has the same function as the function of the MRI apparatus according to the first embodiment, the function of the MRI apparatus according to the second embodiment, or the function of the MRI apparatus according to the third embodiment. The image processing apparatus 900 performs the same process as the process executed by the MRI apparatus according to the first embodiment, the process (excluding the process of acquiring the acquired k-space data) executed by the MRI apparatus according to the second embodiment, and the process executed by the MRI apparatus according to the third embodiment, using the acquired k-space data and the k-space data for reconstruction transmitted from the MRI apparatus 600.

The image processing apparatus 900 includes interface circuitry 901, storage circuitry 902, input circuitry 904, a display 905, and processing circuitry 906.

The interface circuitry 901 is an interface used when the image processing apparatus 900 performs communication with the MRI apparatus 600, the image storage apparatus 700, and the image display apparatus 800. For example, upon receiving the acquired k-space data and the k-space data for reconstruction transmitted from the MRI apparatus 600, the interface circuitry 901 transmits the received acquired k-space data and the k-space data for reconstruction to the processing circuitry 906. For example, the interface circuitry 901 is implemented using a processor.

The storage circuitry 902 stores therein the acquired k-space data and the k-space data for reconstruction, as well as the MR image generated by a generation function 906b, which will be described below. The storage circuitry 902 stores therein various computer programs. For example, the storage circuitry 902 is implemented using a semiconductor memory device such as a random access memory (RAM) and a flash memory, a hard disk, and an optical disk.

The input circuitry 904 receives various instructions and information inputs from an operator. For example, the input circuitry 904 is implemented using a trackball, a switch button, a mouse, a keyboard, and others. The input circuitry 904 is connected to the processing circuitry 906, and transforms the input operations received from the operator to electric signals, and outputs the electric signals to the processing circuitry 906.

The display 905 displays various GUIs, the MR image generated by the generation function 906b, and others, under the control of the processing circuitry 906.

The processing circuitry 906 controls the whole of the image processing apparatus 900. More specifically, upon receiving the acquired k-space data and the k-space data for reconstruction transmitted from the interface circuitry 901, the processing circuitry 906 performs the same process as the process executed by the MRI apparatus according to the first embodiment, the process (excluding the process of acquiring the acquired k-space data) executed by the MRI apparatus according to the second embodiment, or the process executed by the MRI apparatus according to the third embodiment, using the received acquired k-space data and the k-space data for reconstruction. The processing circuitry 906 is implemented using a processor. The processing circuitry 906 includes a data addition function 906a, a generation function 906b, and a deletion function 906c.

The data addition function 906a includes the function (excluding the function of acquiring the acquired k-space data) exerted by the data addition function 122a or the data addition function 226b described above. The generation function 906b has the same function as that of the generation function 122b described above. The deletion function 906c has the same function as that of the deletion function 122c described above.

In this example, the functions of the data addition function 906a, the generation function 906b, and the deletion function 906c, which are the structural components of the processing circuitry 906, are stored in the storage circuitry 902 in the form of computer-executable programs, for example. The processing circuitry 906 implements the functions by reading out each of the computer programs from the storage circuitry 902, and executing the computer program being read out. In other words, the processing circuitry 906 that has read out the computer programs has the functions illustrated in the processing circuitry 906 in FIG. 14.

The image processing apparatus 900 according to the fourth embodiment has been described above. The image processing apparatus 900 has the same function as the function of the MRI apparatus according to the first embodiment, the function (excluding the function of acquiring the acquired k-space data) of the MRI apparatus according to the second apparatus, or the function of the MRI apparatus according to the third embodiment. Consequently, it is possible to prevent the occurrence of a specific artifact that may be generated when the transformation process is performed under the assumption that the data to be transformed are periodically arranged.

Computer Program

The instructions indicated in the processing procedure illustrated in the above-described embodiment can be executed based on a computer program that is software. A general-purpose computer system stores therein the computer program in advance, and by reading in the computer program, the same effect as that by the MRI apparatus and the image processing apparatus in the above-described embodiment can be achieved. The instructions described in the above-described embodiment are recorded as a computer executable program in a magnetic disk (flexible disk, hard disk, and others), an optical disc (CD-ROM, CD-R, CD-RW, DVD-ROM, DVD±R, DVD±RW, and others), a semiconductor memory, or a recording medium similar to the foregoing. As long as it is a storage medium readable by the computer or an embedded system, the memory format thereof may be in any form. When the computer reads in the program from the recording medium and causes the CPU to execute, based on the program, the instructions described in the program, the same operation as that of the MRI apparatus and the image processing apparatus in the above-described embodiment can be implemented. Naturally, when the computer acquires or reads in the program, the computer may acquire or read it via a network.

Furthermore, the operating system (OS) running on the computer based on the instructions of the program installed on the computer or the embedded system from the storage medium, database management software, or middleware (MW) such as a network may execute a part of the respective processing to implement the above-described embodiment.

Moreover, the storage medium is not limited to a medium independent of the computer or the embedded system, and also includes a storage medium in which a computer program transmitted via a local area network (LAN) or the Internet is downloaded and stored or temporarily stored.

The storage medium is not limited to a single medium, and the embodiment includes a situation in which the processing in the above-described embodiment is executed a plurality of media, and thus the configuration of the medium may be in any configuration.

The computer or the embedded system in the embodiment is to execute the respective processing in the above-described embodiment based on the computer program stored in the storage medium, and may be of any configuration such as a device composed of a single device such as a personal computer or a micro-computer and a system in which a plurality of devices are connected via a network.

The computer in the embodiment is not limited to a personal computer, and includes an arithmetic processing unit, micro-computer, and others included in an information processing apparatus, and thus the computer is a generic term for the devices and apparatuses that can implement the functions in the embodiment by a computer program.

With the magnetic resonance imaging apparatus and the image processing apparatus of at least one of the embodiments described above, it is possible to prevent the occurrence of a specific artifact that may be generated when the transformation process is performed under the assumption that the data to be transformed are periodically arranged.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic resonance (MR) imaging apparatus, comprising:
processing circuitry configured to
generate a third k-space data group including a first k-space data group and a second k-space data group, by adding the second k-space data group that is arranged in a second range adjacent to a first range, to the first k-space data group that is arranged in the first range and that is undersampled along at least one of axes in k-space as well as in any axis that is different from the axes in the k-space; and generate an MR image group by performing a reconstruction process on the third k-space data group.

2. The magnetic resonance imaging apparatus according to claim 1, wherein the processing circuitry adds the second k-space group so that signal intensity of the MR image group corresponding to the third k-space data group has continuity.

3. The magnetic resonance imaging apparatus according to claim 1, wherein the processing circuitry adds the second k-space data group based on the first k-space data group.

4. The magnetic resonance imaging apparatus according to claim 1, wherein the processing circuitry deletes an MR image group corresponding to the second range, from the MR image group.

5. The magnetic resonance imaging apparatus according to claim 1, wherein the processing circuitry sets, for a second frame having been closest, to the first range, among a second frame group of the second k-space data group, a first frame having been closest to the second frame, among a first frame group of the first k-space data group and generates a first frame in which signal intensity of a corresponding MR image is similar to the first frame being set, from a plurality of the first frames that are acquired by a sampling pattern corresponding to the second frame, to be the second frame.

6. The magnetic resonance imaging apparatus according to claim 5, wherein the processing circuitry calculates similarity of each of first image space including folding that is obtained by applying Fourier transform to the first frame being set, and second image space including folding that is obtained by applying the Fourier transform to each of the first frames acquired by the sampling pattern corresponding to the second frame having been closest to the first range; and generates a first frame corresponding to the second image space having highest similarity based on calculated similarity, to be the second frame.

7. The magnetic resonance imaging apparatus according to claim 1, wherein the processing circuitry sets, for a second frame having been furthest from the first range, among a second frame group, a first frame having been furthest from the second frame, among a first frame group and generates a first frame in which signal intensity of a corresponding R image is similar to the first frame being set, from a plurality of the first frames that are acquired by a sampling pattern corresponding to the second frame, to be the second frame.

8. The magnetic resonance imaging apparatus according to claim 7, wherein the processing circuitry calculates similarity of each of first image space including folding that is obtained by applying Fourier transform to the first frame being set, and second image space including folding that is obtained by applying the Fourier transform to each of the first frames acquired by the sampling pattern corresponding to the second frame having been furthest from the first range; and generates a first frame corresponding to the second image space having highest similarity based on calculated similarity, to be the second frame.

9. The magnetic resonance imaging apparatus according to claim 7, wherein the processing circuitry generates, for a second frame excluding a second frame that is closest to the first range as well as the second frame that is furthest from the first range, among the second frame group, the second frame, by calculating signal intensity based on signal intensity of an MR image corresponding to a first frame that is closest to the second frame having been closest to the first range, among the first frame group and signal intensity of an MR image corresponding to the first frame that is furthest from the second frame having been furthest from the first range.

10. The magnetic resonance imaging apparatus according to claim 1, wherein the processing circuitry acquires the second k-space data group in addition to the first k-space data group acquired by an acquisition unit, and adds the acquired second k-space data group to the first k-space data group.

11. A magnetic resonance (MR) imaging apparatus, comprising:
processing circuitry configured to
apply a window function to a plurality of pieces of third data including a plurality of pieces of first data that are a plurality of pieces of k-space data that, are arranged in a first range and a plurality of pieces of second data that are a plurality of pieces of k-space data that are arranged in a second range adjacent to the first range, so that a function representing signal intensity of a plurality of MR images corresponding to the pieces of third data has continuity when the pieces of third data are arranged in a direction toward which the first range and the second range are arranged;
generate the MR images by performing a reconstruction process on the pieces of third data applied with the window function; and
delete the MR image corresponding to the second range, from the generated MR images.

12. An image processing apparatus, comprising:
processing circuitry configured to
generate a third k-space data group including a first k-space data group and a second k-space data group, by adding the second k-space data group that is arranged in a second range adjacent to a first range, to the first k-space data group that is arranged in the first range, and that is undersampled along at least one of axes in k-space as well as in any axis that is different from the axes in the k-space; and
generate a magnetic resonance (MR) image group by performing a reconstruction process on the third k-space data group.

* * * * *